US008650468B2

(12) United States Patent
Fisher-Jeffes et al.

(10) Patent No.: US 8,650,468 B2
(45) Date of Patent: Feb. 11, 2014

(54) INITIALIZING DECODING METRICS

(75) Inventors: Timothy Perrin Fisher-Jeffes, Cambridge, MA (US); Chiaming Lo, Tustin, CA (US); Ganning Yang, Irvine, CA (US)

(73) Assignee: MediaTek Pte. Ltd., Singapore (SG)

( * ) Notice: Subject to any disclaimer, the term of this patent is extended or adjusted under 35 U.S.C. 154(b) by 426 days.

(21) Appl. No.: 12/843,896

(22) Filed: Jul. 27, 2010

(65) Prior Publication Data

US 2012/0030536 A1 Feb. 2, 2012

(51) Int. Cl.
*G06F 11/00* (2006.01)

(52) U.S. Cl.
USPC .......................................... 714/796; 714/792

(58) Field of Classification Search
None
See application file for complete search history.

(56) References Cited

U.S. PATENT DOCUMENTS

| 2004/0039769 A1* | 2/2004 | Orio .............................. 708/530 |
| 2005/0172204 A1* | 8/2005 | Lin ............................... 714/755 |
| 2007/0162837 A1* | 7/2007 | Nieminen ...................... 714/796 |

OTHER PUBLICATIONS

International Search Report mailed on Dec. 12, 2011 for International application No. PCT/US11/44906, International filed:Jul. 21, 2011.

* cited by examiner

*Primary Examiner* — Scott Baderman
*Assistant Examiner* — Jason Bryan
(74) *Attorney, Agent, or Firm* — Winston Hsu; Scott Margo (57) ABSTRACT

A method includes, during a first iteration of a first decoder for decoding convolutionally encoded data elements, determining a first value of a first path metric. The method also includes, during a second iteration of the first decoder, determining a second value of the first path metric by using the first value of the first path metric as an initial value of the first path metric.

12 Claims, 6 Drawing Sheets

INITIALIZING DECODING METRICS

BACKGROUND

This description relates to a system and method for initializing metrics for decoding data, such as data encoded with convolutional codes.

For information transmission and reception, various types of error correcting codes have been developed along with corresponding decoding algorithms. To provide strong error correcting capabilities, such codes may call for cumbersome and complex decoders to approach the theoretical limits of data transmission such as channel capacity (referred to as the Shannon limit after Claude Shannon, who introduced the notion in 1948). To reduce complexity, in one technique, multiple relatively straight forward codes, each of which may not individually provide significant error correcting capabilities, are concatenated to produce a longer code that can provide enhanced error correcting capabilities.

SUMMARY

In general, in one aspect, a method includes, during a first iteration of a first decoder for decoding convolutionally encoded data elements, determining a first value of a first path metric. The method also includes, during a second iteration of the first decoder, determining a second value of the first path metric by using the first value of the first path metric as an initial value of the first path metric.

Implementations may include one or more of the following features. The method may also include, during the first iteration of the first decoder, determining a first value of a second path metric, and during the second iteration of the first decoder, determining a second value of the second path metric by using the first value of the second path metric as an initial value of the second path metric. Determining the first value of the first path metric may include calculating a full trace across a trellis in the forward direction. Determining the first value of the second path metric may include calculating a full trace across a trellis in the reverse direction. The first path metric may be a forward path metric. The first path metric may be a backward path metric. The method may also include, during the first iteration of a first decoder, providing extrinsic data from the first decoder to a second decoder. The method may also include, prior to the second iteration of the first decoder, receiving extrinsic data at the first decoder from the second decoder. The first decoder may be a linear decoder of a Turbo decoder and the second decoder may an interleaved decoder of a Turbo decoder. Further, the first path metric may be a forward path metric, the second path metric may be backward path metric, and determining values of the first path metric and the second path metric may alternate with subsequent iterations.

In general, in another aspect, a computing device includes a computing device includes a first decoder for decoding convolutionally encoded data elements. The first decoder is configured to, during a first iteration, determine a first value of a first path metric. The first decode is further configured to, during a second iteration, determine a second value of the first path metric by using the first value of the first path metric as an initial value of the first path metric.

Implementations may include one or more of the following features. The first decoder may be further configured to, during the first iteration, determine a first value of a second path metric, and, during the second iteration, determine a second value of the second path metric by using the first value of the second path metric as an initial value of the second path metric. To determine the first value of the first path metric, the first decoder may calculate a full trace across a trellis in the forward direction. To determine the first value of the second path metric, the first decoder may calculate a full trace across a trellis in the reverse direction. The first path metric may a forward path metric or a backward path metric. The computing device may further include a second decoder for receiving extrinsic data from the first decoder during the first iteration. The first decoder may receive extrinsic data from the second decoder prior to the second iteration of the first decoder. The first decoder may be a linear decoder of a Turbo decoder, and, the second decoder may be an interleaved decoder of a Turbo decoder. The first path metric may be a forward path metric, the second path metric may be backward path metric, and determining values of the first path metric and the second path metric may alternate with subsequent iterations.

In general, in another aspect, a computer program product tangibly embodied in an information carrier and comprises instructions that when executed by a processor perform a method including, during a first iteration of a first decoder for decoding convolutionally encoded data elements, determining a first value of a first path metric. The method also includes during a second iteration of the first decoder, determining a second value of the first path metric by using the first value of the first path metric as an initial value of the first path metric.

Implementations may include one or more of the following features. Further instructions may be included that when executed by the processor perform a method that includes during the first iteration of the first decoder, determining a first value of a second path metric. The method may also include during the second iteration of the first decoder, determining a second value of the second path metric by using the first value of the second path metric as an initial value of the second path metric. Determining the first value of the first path metric may include calculating a full trace across a trellis in the forward direction. Determining the first value of the second path metric may include calculating a full trace across a trellis in the reverse direction. The first path metric is a forward path metric or a backward path metric. The method may also include, during the first iteration of a first decoder, providing extrinsic data from the first decoder to a second decoder. The method may also include, prior to the second iteration of the first decoder, receiving extrinsic data at the first decoder from the second decoder. The first decoder may be a linear decoder of a Turbo decoder, and, the second decoder may be an interleaved decoder of a Turbo decoder. The first path metric may be a forward path metric, the second path metric may be a backward path metric, and determining values of the first path metric and the second path metric may alternate with subsequent iterations.

These and other aspects and features and various combinations of them may be expressed as methods, apparatus, systems, means for performing functions, program products, and in other ways.

Other features and advantages will be apparent from the description in the claims.

DETAILED DESCRIPTION

Figure 1:
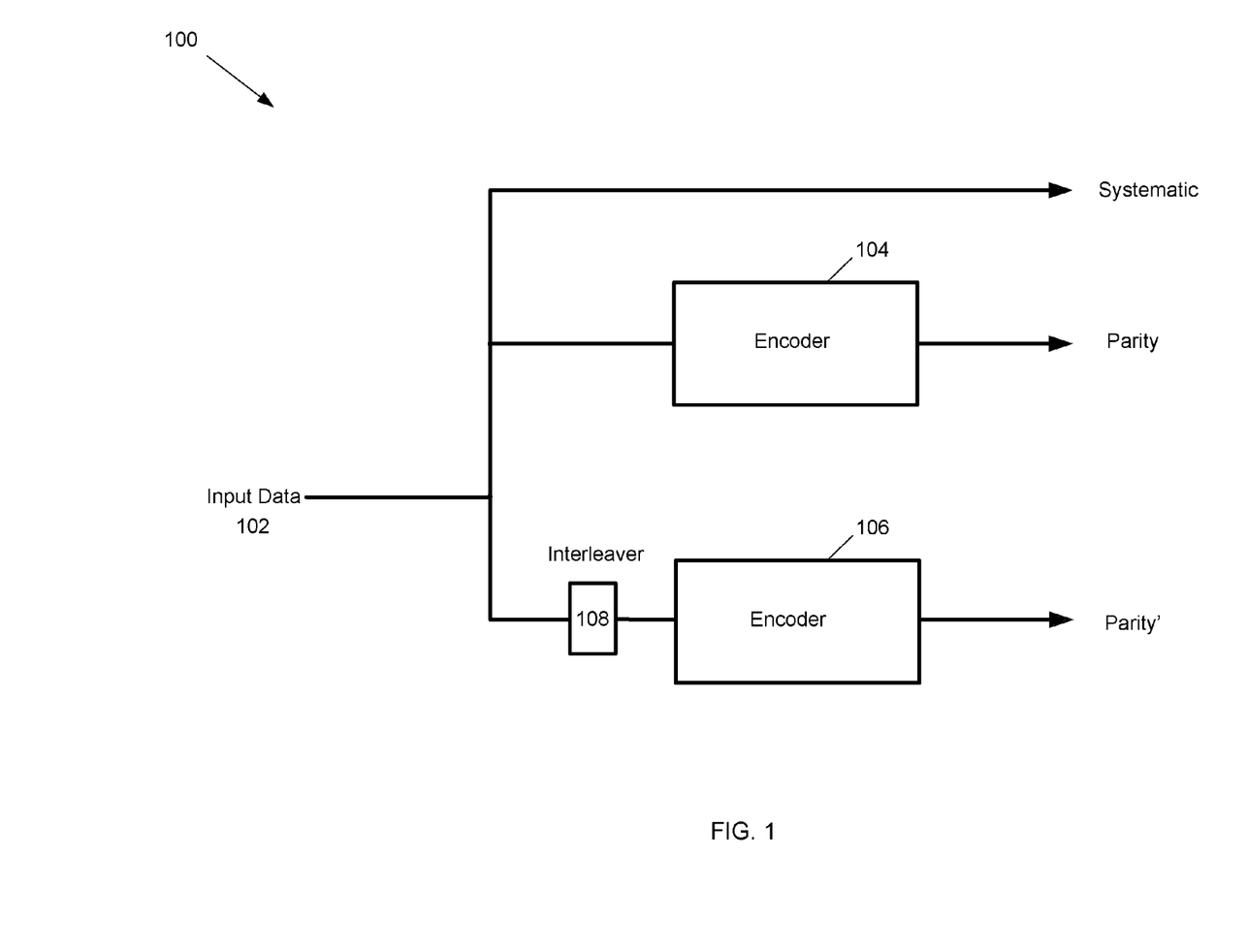
FIG. 1 is a block diagram of a portion of an encoding system.

Referring to FIG. 1, an exemplary encoding system 100 may employ one or more encoding techniques to prepare data (e.g., data elements such as symbols) for transmission over a communication channel. Implementing such encoding techniques may be used for correcting errors detected at a receiver. In this particular arrangement, the encoding system 100 implements a turbo code architecture in which, for this example, two convolutional codes are used to encode input data 102 by producing three output bits for each bit included in the input data. As illustrated, each input bit is also provided as an output (referred to as being in systematic form) for transmission along with the output of the two convolutional codes. In general, a turbo code is formed from the parallel concatenation of two codes separated by an interleaver. As such, two encoders 104, 106 are implemented and operate in similar manners to apply one or more codes (e.g., a recursive systematic convolutional (RSC) code) to the input data 102. To separate the codes applied by the encoders 104 and 106, an interleaver 108 processes the input data 102 prior to being provided to the encoder 106. As such, the interleaved version of the input data 102 causes the encoder 106 to output data that is quite different from the data output from the encoder 104. As such, two separate codes are produced that may be combined in a parallel manner. Such combinations lend to allowing portions of the combined code to be separately decoded. Further, the performance of each decoder may be improved by exchanging information separately extracted from each of the decoders. Due to the interleaver 108 providing a different input data to the encoder 106 (compared to the input data of encoder 104), the output of the encoder 106 is different (e.g., uncorrelated) from the output of the encoder 104. As such, more information is transmitted that may used by a receiver for detecting errors and possibly correcting errors in the transmitted data.

In general, the interleaver 108 can be considered as rearranging the order of the data elements (e.g., bits) of the input data 102 in a pseudo-random, albeit a deterministic order. To provide such functionality, the interleaver 108 may implement one or more interleaver techniques such as row-column, helical, odd-even, pseudo-random, etc. Along with the systematic output data, each of the encoders 104 and 106 outputs parity data (identified as Parity and Parity') that is also transmitted to provide additional information for error detection and correction.

Figure 2:
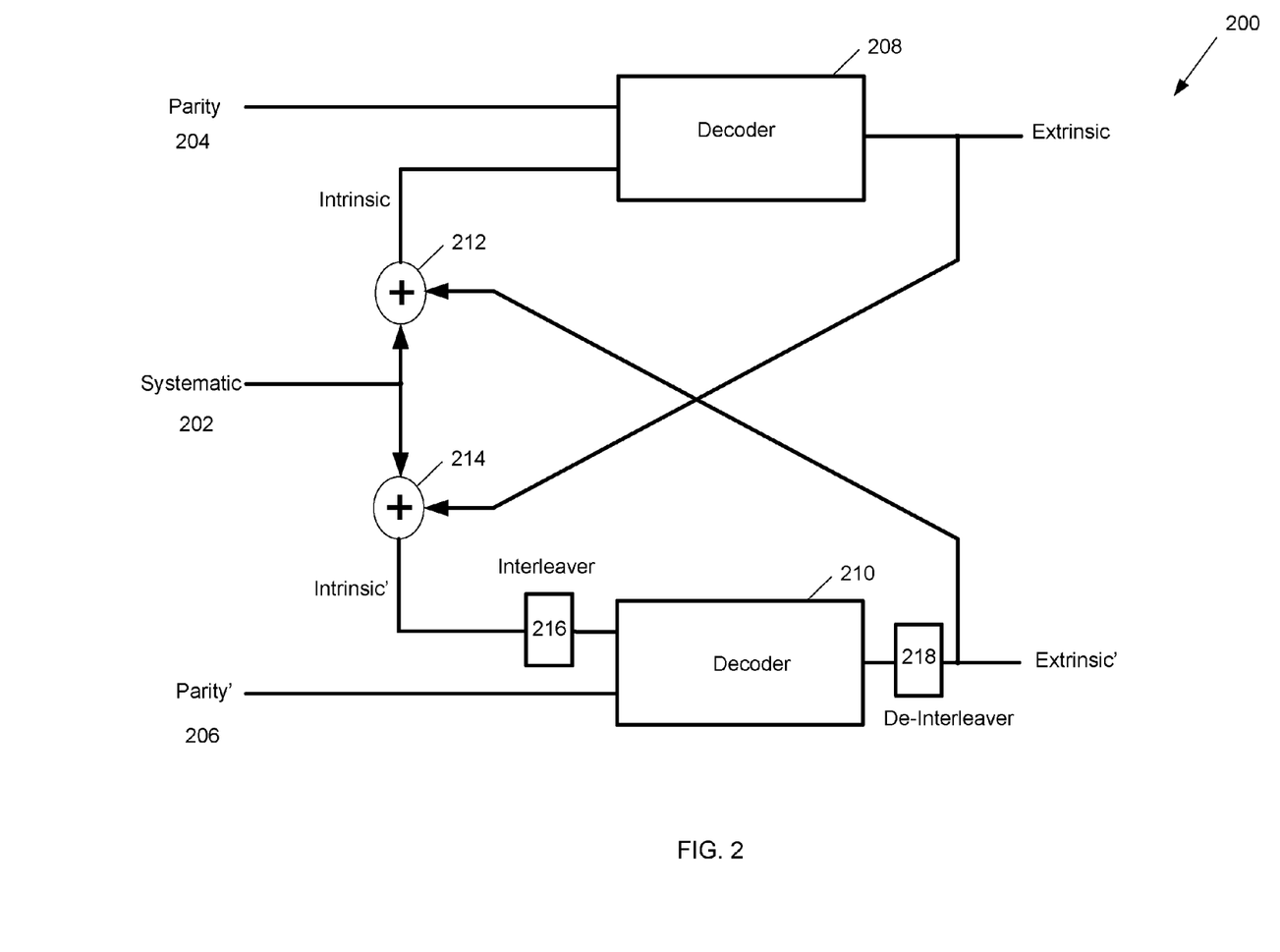
FIG. 2 is a block diagram of a portion of a decoding system.

Referring to FIG. 2, a block diagram of an exemplary decoding system 200 is illustrated that is capable of decoding data that has been encoded by one or more techniques. For example, encoded data provided from the encoding system 100 (shown in FIG. 1) may be decoded by the decoding system 200. In such a scenario, the three data sets provided from the encoding system 100 are received by the decoding system 200. In particular, along with systematic data (identified as Systematic 202), both sets of parity data (e.g., Parity 204 and Parity' 206) are received and provide controlled redundancy to the transmitted data such that the decoding system 200 can detect the presence of transmission errors, and where possible, correct the errors.

Various types of decoding techniques may be used to reveal the transmitted encoded data. For example, in some arrangements a receiver associated with a decoding system may render a determination about a received data bit (e.g., represents a binary value of 0 or 1). Once determined, the data bit may be provided to the decoding system for further processing. For such a technique, some data bits are typically determined with greater certainty than others, however, information used to make the determination may not be provided and exploited by the decoding system. In some arrangements, the decoding system may be provided a numerical value (referred to as a "soft" input) rather than a "hard" determination from the receiver. Provided this input, the decoding system may output (for each data bit) an estimate that reflects the probability associated with the transmitted data bit (e.g., probability of binary value 0 or 1).

In this particular arrangement, the decoding system 200 includes two decoders 208 and 210 that may use a decoding technique such as Viterbi decoding (or another type of technique). In general, the decoding system 200 uses a recursive decoding technique such that the decoder 208 provides an extrinsic output (labeled "Extrinsic") that can be considered an error estimate of the systematic input 202. Similarly, the decoder 210 provides extrinsic output (labeled "Extrinsic'"). Combined with the systematic input (via adders 212 and 214), the sums (e.g., Systematic+Extrinsic, Systematic+Extrinsic'), which are referred to as intrinsic data (e.g., Intrinsic=Systematic+Extrinsic and Intrinsic'=Systematic+Extrinsic'), are respectively provided to decoder 208 and decoder 210. Similarly, the received Parity and Parity' data are respectively provided to decoders 208, 210. While various techniques may be used, typically the data (e.g., Parity, Parity', Intrinsic, Intrinsic'/Extrinsic, Extrinsic', and Systematic) are stored in one or more memories that are accessible by the respective decoders 208, 210 for retrieval.

By using three sets of data (e.g., Systematic, Parity and Parity') to transmit information, the encoding system 100 and decoding system 200 are considered to be a rate three code. However, with the ever increasing need for higher code rates, systems are called upon to approach a rate one code, which primarily draw upon the information provided by systematic data and attempts to reduce the need for information provided by parity data (e.g., Parity and Parity'). However, significantly reducing the amount of parity data to approach a rate one code typically degrades performance below a useful level. As such, while a rate one code can be approached, some portion of parity data is needed to provide appropriate performance. As such, improving system performance should include the use of the information provided by the input data (e.g., Systematic 202, Parity 204 and Parity' 206) and information produced by the decoding system (e.g., extrinsic data) from the input data.

A decoder that operates over the entire input data set of systematic and parity information is generally known as a full traceback decoder, and is considered optimal but practically unrealizable without significant overhead. One practical architectural aspect of a realizable turbo decoder is to typically not execute the decode operation over the entire input data set of systematic and parity information, but rather to break the data into smaller more manageable windows. A windowed decoder that provides full traceback performance can expend significant (if not practically unrealizable) computational overhead for calculating initial values to initialize a decode window. As such, some rationales for a windowed decoder may include reducing the needs for storing parameters associated with calculations (e.g., path metrics) and reducing the computational overhead in calculating initial values to initialize a window of decode.

Due to the recursive nature of the processing executed by the decoding system 200, techniques may be implemented to use and reuse information during processing iterations that may have been determined during one or more previous iterations. For example, processing metrics calculated by decoder 208 (referred to as a linear code decoder) during one iteration, may be stored and used in subsequent processing iterations.

Similarly, processing metrics calculated by decoder 210 (referred to as an interleaved code decoder since its input is provided by interleaver 216) during one iteration may be used in subsequent iterations. In this arrangement, the processing metrics are path metrics, which are used to calculate extrinsic outputs (e.g., Extrinsic, Extrinsic') that are stored for use in subsequent processing iterations. In some conventional systems, such path metrics may be initially set to values of zero for each decoder window iteration (although not necessarily for backward or reverse path metrics). However, at higher coding rates such zero value initializing can degrade performance. To determine such path metrics, one or more processing techniques may be implemented. For example, path metrics associated with end positions of a decoder window may be calculated and stored as initial values during one iteration and provided to appropriate decoder window start positions for multiple (or all) subsequent iterations of subsequent calculations. While, such an arrangement would provide values for initializing path metrics (in subsequent processing iterations), over time (and iterations), these initial values may become less valid. To combat the initial values from becoming stale, one or more techniques may be implemented. For example, path metrics aligning with decoder window end positions (again, generally but not necessarily backward or reverse path metrics) that are already being calculated in one iteration may be stored during alternating linear and interleaved processing iterations and used to initialize decoder window start position path metrics during the following like-cycle iterations. To execute such operations generally would call for adding an initial value path metric store for both linear and interleaved iterations. In another implementation, path metrics (alternating between backward/reverse path metrics and forward path metrics) may be aligned with decoder window end positions that are being calculated during one iteration for storing during alternating linear and interleaved processing iterations. The path metrics can be used to initialize decoder window start position path metrics during the following like-cycle iterations. Such operations may optimally preserve the freshness of initial values without the costly overhead of implementing full traceback. To execute such operations, the architecture of the associated decoder may need further adjustments. For example, the decoder may need to execute the equivalent operations in forward and reverse directions.

Various types of architectures and techniques may be implemented for providing path metrics to subsequent decoding iterations. For example, memory accessible by the decoders 208, 210 may be used to store and retrieve metric values. The decoders 208, 210 may share memory or been assigned dedicated memory (e.g., individual buffers) for metric storage and retrieval. During each storage operation, various amounts of metric values may be stored, for example, stored amounts may be based upon a window architecture implemented in the decoding system.

Once produced, each of the decoders 208, 210 provide extrinsic data (e.g., a de-interleaver 218 provides re-ordered extrinsic data from the decoder 210) to the respective adders 212, 214 to continue the recursive processing of the systematic data 202.

Figure 3:
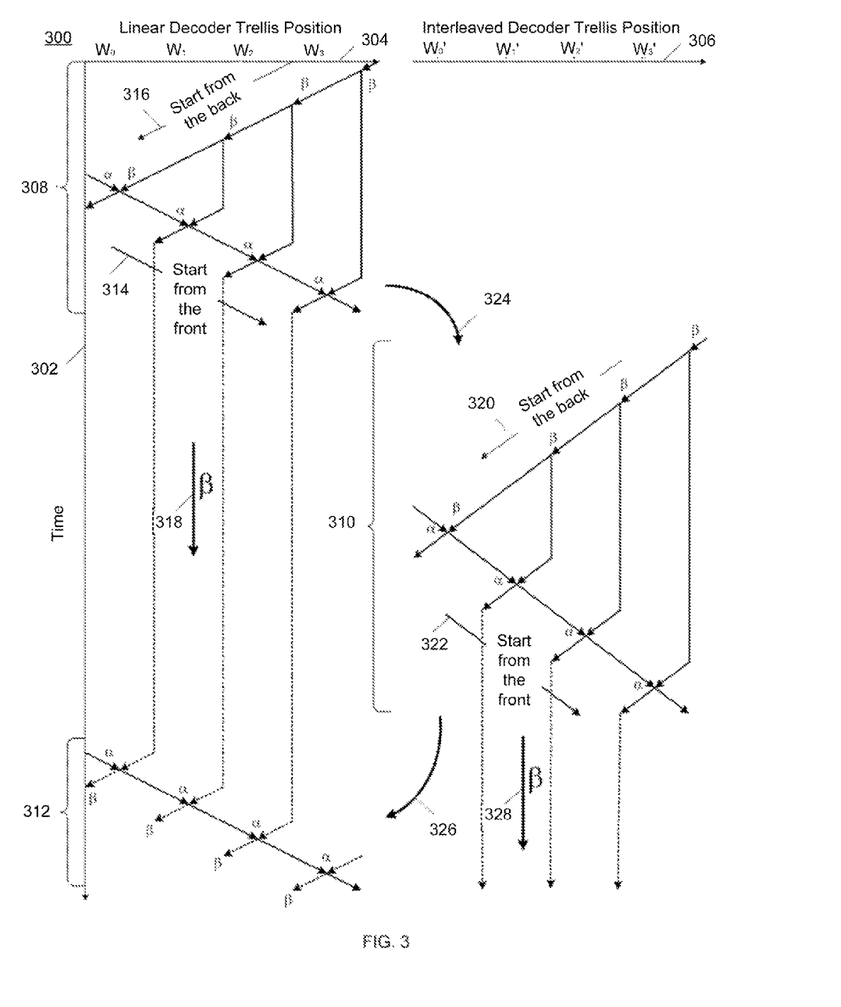
FIGS. 3 and 4 are charts that represent iterations of data decoding operations.

Referring to FIG. 3, a decoder scheduling diagram 300 illustrates one methodology for calculating and using path metrics over multiple decoder iterations. The left hand side of the diagram 300 represents operations of a linear decoder (e.g., decoder 208 shown in FIG. 2) and the right hand side of the diagram represents operations of the an interleaved decoder (e.g. decoder 210 also shown in FIG. 2). For both sides of the diagram 300, axis 302 represents time and extends from the top to the bottom of the figure. Axes 304 and 306 correspondingly represent information bit positions associated with each of the decoders. For ease of illustrations, four windows (e.g., $W_0$, $W_1$, $W_2$ and $W_3$) are associated with each of the decoders, however, additional windows (e.g., eight, etc.) are typical. Also, in this particular example, operations associated with the linear decoder are illustrated as being initially executed in time. However, operations of the interleaved decoder may be similarly illustrated as being initially executed.

The diagram 300 represents iterations 308, 310 and 312 as being executed in an alternating manner between the two decoders. In particular, the linear decoder executes iteration 308 to produce and extrinsic output that is provided to the interleaved decoder. Processing the extrinsic output (along with other data such as parity and systematic data) during iteration 310, the interleaved decoder calculates an extrinsic output that is provided to the linear decoder for processing in iteration 312. While three iterations are illustrated to demonstrate exchanging data, many additional iterations may be required for decoding transmitted data elements.

To calculate the extrinsic output for each iteration, path metrics (also referred to as state metrics) are respectively used by the linear and interleaved decoders. One path metric, the forward path metric ($\alpha$), is obtained through the forward recursion (of the trellis), and the second path metric, ($\beta$), is determined by backward recursion (of the trellis). As illustrated in the iteration 308, $\alpha$ path metrics are calculated for each window moving in the forward direction (left to right and represented with arrow 314) across the windows (referred to as full trace forward). Rather than being calculated from the start of the trellis, the $\beta$ path metrics are calculated from the end of the trellis. As represented by arrow 316, $\beta$ path metrics are calculated for each window moving right to left in the reverse direction (referred to as full trace back).

Along with using the $\alpha$ and $\beta$ path metrics to calculate the extrinsic output (for the iteration 308) as represented by arrow 324, the metric values may be stored for subsequent iterations. Conventional decoders that implement sliding window architectures initially set either $\alpha$ or $\beta$ path metrics to values of zero at the start of each window. As such, metric information gathered during one iteration is not used to assist subsequent iterations. But by providing path metric values associated with one or more previous iterations (e.g., by retrieving stored values), subsequent iterations are passed improved approximations for initial values. In this particular example, the $\beta$ path metrics are stored by the linear decoder and used during the iteration 312 (as represented by arrow 318) for initializing corresponding $\beta$ metrics.

Similar to the linear decoder, path metrics $\alpha$ and $\beta$ are also determined by operations of the interleaved decoder (e.g., decoder 210 shown in FIG. 2). Based upon the extrinsic information provided by the linear decoder and additional information (e.g., Parity' data), path metrics $\alpha$ and $\beta$ are calculated. In this particular arrangement, the interleaved decoder executes a full trace back through the trellis (as represented by arrow 320) to determine $\beta$ path metrics and a full trace forward (as represented by arrow 322) to determine $\alpha$ path metrics in the forward direction. Once determined, the $\beta$ path metrics are stored for use during subsequent iterations of the interleaved decoder to provide initial values (as represented by arrow 328. Additionally, the interleaved decoder performs other operations, for example, extrinsic data (e.g., Extrinsic' shown in FIG. 2) is calculated and is provided to the linear decoder for user during the next iteration (e.g., iteration 312) as represented by arrow 326.

By accessing stored path metrics and using the metrics as initial values, full trace back operations may not be needed for each subsequent iteration. As such, processing time and resources are conserved by using path metrics determined in previous iterations. In this example, the β path metrics are retrieved (e.g., from a memory) and used as initial values for the convergence window. As illustrated in iteration 312, α path metrics are determined by a full trace forward through the trellis while the β path metrics are retrieved from memory. Continuing with subsequent iterations beyond iteration 312, the β path metrics are appropriately retrieved in a similar manner from memory and used for computations (e.g., calculating extrinsic data). For the interleaved decoder, the determined and stored β path metrics during iteration 310 are also used in subsequent iterations (not represented in the figure) for that decoder, thereby further reducing the need for computational resources.

While β path metrics are initially determined (from a full trace back) for both the linear and interleaved decoder (and used in all subsequent iterations) in this particular arrangement, other methodologies may also be utilized. For example, α path metrics may also be calculated, stored and retrieved for use during later iterations. In one arrangement, α path metrics may be determined during the same iteration that β path metrics are determined and stored (for later use). Path metrics may also be determined on alternating iterations or by using other types of iteration pattern. For example, β path metrics may be determined during one iteration and α path metrics may be determined during the next iteration. Such a technique provides relatively current path metrics since each metric is no more than one iteration from creation from a full trace.

Figure 4:
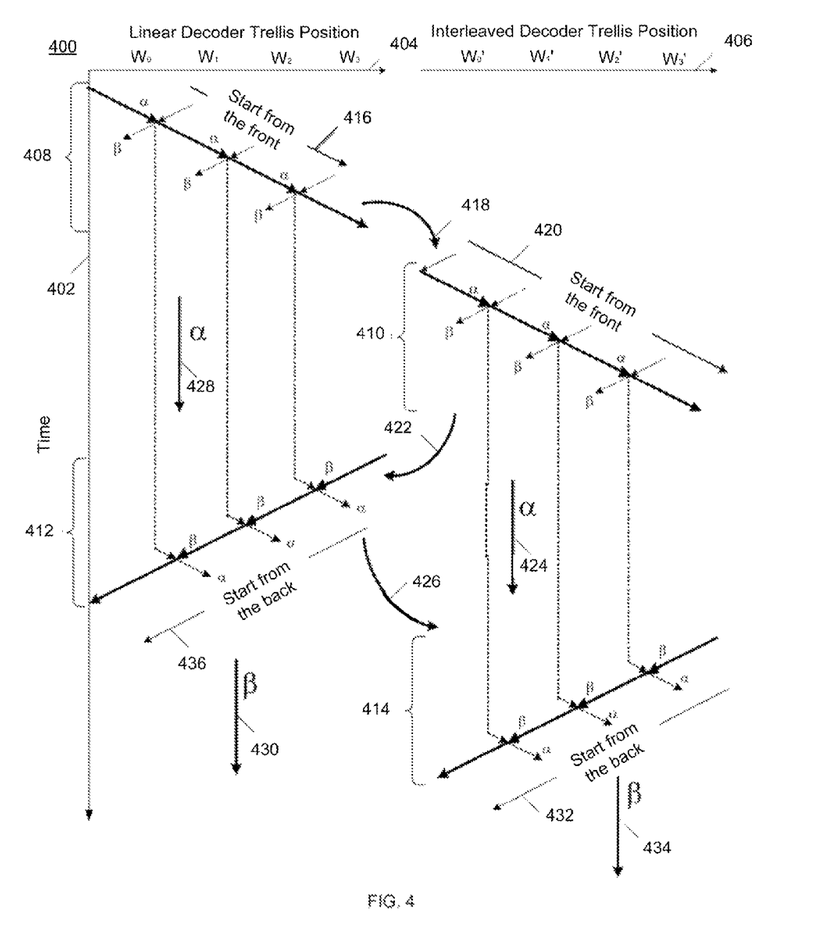

Referring to FIG. 4, rather than calculating and storing one type of path metric (e.g., β path metrics) for use during subsequent iterations, a decoder scheduling diagram 400 illustrates calculating different path metrics during alternating decoder iterations. In this particular example, α path metrics are first calculated (during a full trace forward of the trellis) and stored. During the next iteration, β path metrics are calculated during a full trace back and are used with the stored α path metrics. The calculated β path metrics are stored for use during the following iteration. By alternating between α and β path metric determinations for each iteration, relatively current path metrics are present during each iteration. As such, "stale" path metrics information is not used over a significant period of time or number of iterations.

Similar to the scheduling diagram 300 (shown in FIG. 3), the left hand side of the diagram 400 represents operations of a linear decoder (e.g., decoder 208 shown in FIG. 2) and the right hand side represents operations of an interleaved decoder (e.g. decoder 210 also shown in FIG. 2). A vertical axis 402 represents time and horizontal axes 404 and 406 respectively represent information bit positions of four windows (e.g., $W_0$, $W_1$, $W_2$ and $W_3$) associated with the decoders. Additional windows are typical, but for illustrative purposes only fours windows are included in the figure. Also, while operations associated with the linear decoder are illustrated as initially being executed, operations of the interleaved decoder may be represented as being initially executed in other arrangements. Also similar to the diagram 300, iterations 408, 410, 412 and 414 associated with the two decoders are illustrated as being executed in an alternating manner.

For iteration 408, α path metrics are determined from a full trace forward, as represented by arrow 416 and β path metrics are determined from predefined initial values (e.g., zero values). From the path metrics provided to the linear decoder, extrinsic data is calculated and provided to the interleaved decoder, as represented by arrow 418. Additionally, the α path metrics are stored (as represented by arrow 428) for use during a subsequent iteration (e.g., iteration 412). In this arrangement, operations executed by the interleaved decoder during iteration 410 are similar to the operations executed by the linear decoder during iteration 408. For example, α path metrics are determined by a full trace forward (as represented by arrow 420) and β path metrics are calculated in a partial manner from predefined initial values. Once determined, the α and β path metrics are used by the interleaved decoder to determine extrinsic data that is provided to the linear decoder (as represented by arrow 422). Additionally, the α path metrics are stored (as represented by the arrow 424) for use during the next iteration of the interleaved decoder.

For the next iteration, iteration 412, the linear decoder retrieves the stored α path metrics and determines the β path metrics by executing a full trace back, as represented by arrow 436. Similar to the earlier iterations, the α and β path metrics are used to calculate extrinsic data that is used by the interleaved decoder during the next iteration 414 (as represented with arrow 426. The β path metrics are also stored for use in the subsequent iteration of the linear decoder (as represented with arrow 430). By alternating between path metric calculations, no more than one iteration has passed since the path metrics (being used) have been calculated from a full trace in one or the other direction. In a similar manner, for the next iteration of the interleaved decoder, iteration 414, α path metrics are retrieved from storage and β path metrics are determined from a full trace back (as represented by arrow 432). The β path metrics are also stored (as represented with arrow 434) for the execution of the next iteration of the interleaved decoder.

The scheduling diagrams illustrated in FIGS. 3 and 4 represent two methodologies for providing relatively current path metrics to each decoder, however, other techniques may be implemented. For example, path metrics may be calculated and stored for use during two or more iterations. To implement operations associated with these techniques, in particular full trace forward and full trace back, functions of the linear and interleaved decoders may need to operate in forward and reverse directions. For example, along with interleaver operations capable of being executed in the forward and reverse direction, error checking (e.g., cyclic redundancy check (CRC)) and other decoding operations may need to be capable of bi-directional execution.

Figure 5:
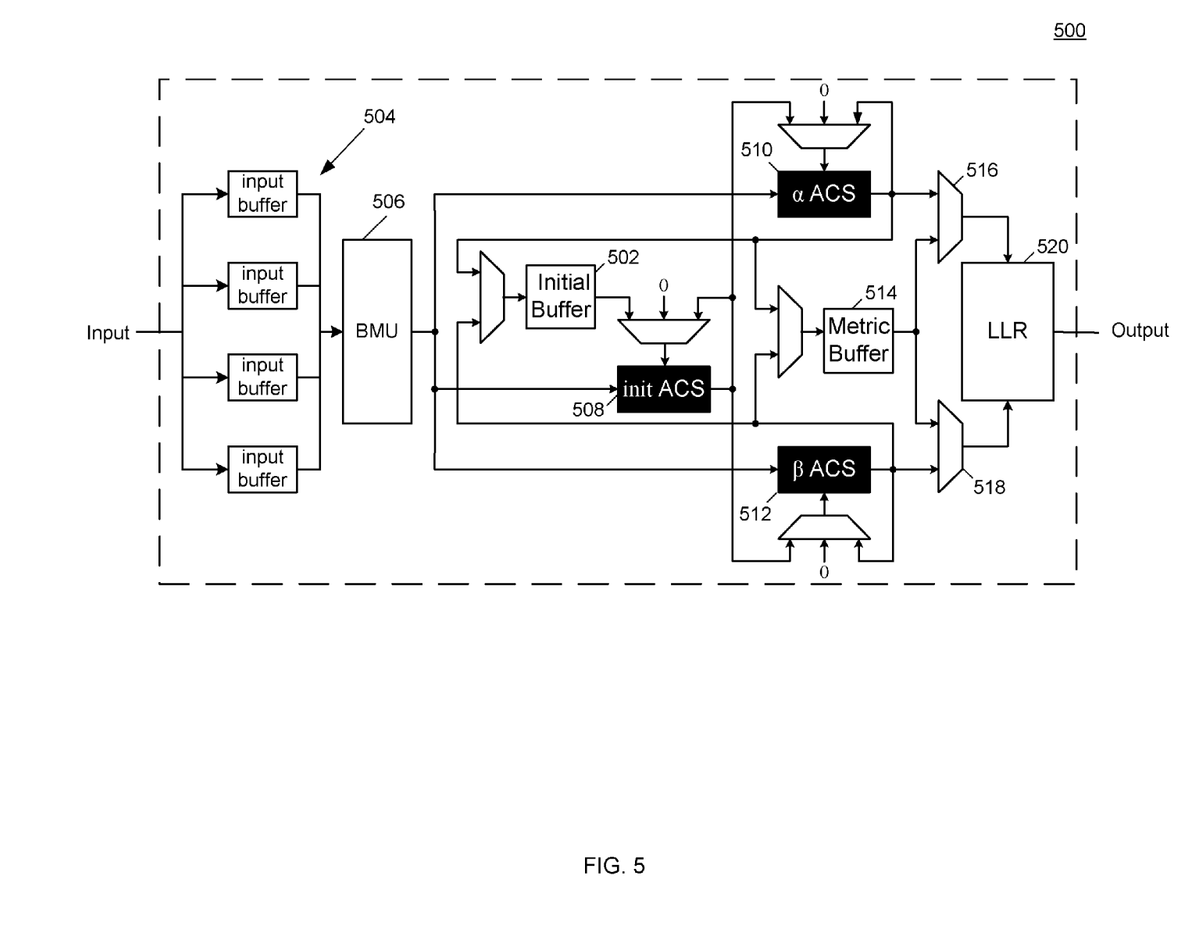
FIG. 5 is a block diagram of portions of a decoder.

Referring to FIG. 5, a block diagram 500 represents exemplary functions of a maximum a posteriori (MAP) decoder that implements window operations and is capable of trellis traversing in either direction (e.g., forward and backward directions). Similar to the operations illustrated in FIG. 4, the MAP decoder is capable of traversing a full trace of a trellis from one end of a codeblock to the other. The decoder alternates between determining forward and backward path metrics (for every other iteration) for both linear and interleaved decoding portions. At predefined window length positions, the fully traced path metric values are stored in an initial buffer 502 and later retrieved for use as initial values. Typically, codeblock sizes are approximately 5114 bits, thereby, 80 window lengths of 64 bits each may be used to produce metrics for the initial buffer 502. In this implementation the single buffer 502 is capable of storing initial path metrics for both linear and interleaved decoder operations, however, multiple buffers may be implemented. For example, one buffer may be incorporated for linear decoder operations and a second buffer is implemented for interleaved decoding operations.

In this arrangement a series of input buffers 504 receives input (e.g., parity, systematic and extrinsic information) for decoding operations. The input information is provided to a branch metric unit (BMU) 506 that calculates branch metrics (e.g., that represent distances between received symbols and possible symbols) from the data provided from the input buffers 504. Along with the branch metrics provided by the BMU 506, metrics from initial buffer 502 (via an initial add-compare-select (ACS) unit 508) are respectively provided to ACS units 510, 512 for producing the $\alpha$ and $\beta$ path metrics. In this arrangement, a metric buffer 514 stores the $\alpha$ or $\beta$ path metrics depending upon the direction of traverse. A pair of multiplexers 516, 518 provide the $\alpha$ and $\beta$ path metrics (either from the ACS units or stored in the metric buffer 514) to a log-likelihood ratio (LLR) unit 520 to calculate values that represent the likelihood of bit values (the extrinsic data).

Figure 6:
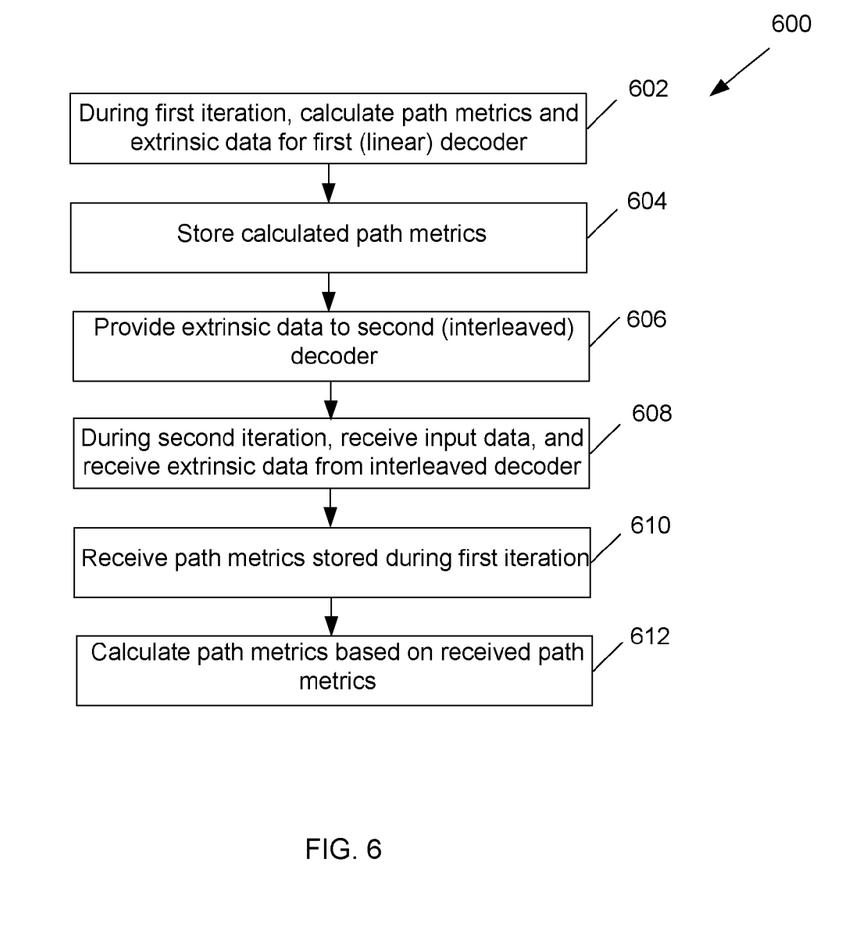
FIG. 6 is a flowchart of operations of a decoder.

Referring to FIG. 6, a flowchart 600 represents some of the operations of a decoder such as a linear decoder (e.g., decoder 208) or an interleaved decoder (e.g., decoder 210). Such a decoder may be implemented in one or more types of hardware architectures such as a processor based architecture or other type of design. In some processor based architectures, the decoder may be executed on a single processor or distributed across multiple processors. Various types of circuitry (e.g., combinational logic, sequential logic, etc.) and computing devices (e.g., a computer system) may also be used individually or in combination to execute the operations of the decoder. For example, in a processor-based decoding system design, instructions may be executed by a processor (e.g., a microprocessor) to provide the operations of the decoder. Such instructions may be stored in a storage device (e.g., hard drive, CD-ROM, etc.) and provided to the processor (or multiple processors) for execution.

Operations of the decoder may include, during a first decoding iteration, calculating 602 path metrics (e.g., $\alpha$ path metrics, $\beta$ path metrics, etc.) and corresponding extrinsic data from input data such as systematic data, parity data, etc. In this example, operations of the flowchart 600 are described with relation to a linear decoder (such as the decoder 208, shown in FIG. 2), however, such operations may be mapped to an interleaved decoder (such as the decoder 210, also shown in FIG. 2). Once the metrics are calculated, operations may also include storing 604 the path metrics and providing 606 the extrinsic data to a second decoder (e.g., an interleaved decoder). By providing the extrinsic data, the second decoder may similarly (during a separate decoding iteration) calculate path metrics and calculate extrinsic data from input data (e.g., systematic data, parity data, etc.) and the extrinsic data (provided from the first decoder). Once complete, during a second decoding iteration, extrinsic data may be received 608 at the decoder (from the second decoder) along with corresponding input data (e.g., systematic data, parity data, etc.). Also during this second iteration, operations include receiving 610 the path metrics stored during the first iteration. From the received path metrics, the decoder calculates 612 path metrics associated with this second decoding iteration. For example, $\alpha$ path metrics may be calculated and stored during the first decoding iteration. By retrieving the stored $\alpha$ path metrics during the second iteration, the decoder can use the retrieved metrics as initial $\alpha$ path metric values during this subsequent iteration. As such, the retrieved metrics may be used in other calculations involving other metrics (e.g., $\beta$ path metrics). In this particular example, $\alpha$ path metrics are stored during one iteration and retrieved during a subsequent decoding iteration. Similarly, in some arrangements, $\beta$ path metrics may be calculated during one iteration and stored for use during one or more subsequent iterations.

As mentioned above, in some decoding system designs may be processor based. As such, to perform the operations described in the flow chart 600, the decoder and optionally with other portions of the decoder system may perform any of the computer-implemented methods described previously, according to one implementation. For example, the decoding system may include a computing device (e.g., a computer system) for executing instructions associated with the decoding data elements. The computing device may include a processor, a memory, a storage device, and an input/output device. Each of the components may be interconnected using a system bus or other similar structure. The processor may be capable of processing instructions for execution within the computing device. In one implementation, the processor is a single-threaded processor. In another implementation, the processor is a multi-threaded processor. The processor is capable of processing instructions stored in the memory or on the storage device to display graphical information for a user interface on the input/output device.

The memory stores information within the computing device. In one implementation, the memory is a computer-readable medium. In one implementation, the memory is a volatile memory unit. In another implementation, the memory is a non-volatile memory unit.

The storage device is capable of providing mass storage for the computing device. In one implementation, the storage device is a computer-readable medium. In various different implementations, the storage device may be a floppy disk device, a hard disk device, an optical disk device, or a tape device.

The input/output device provides input/output operations for the computing device. In one implementation, the input/output device includes a keyboard and/or pointing device. In another implementation, the input/output device includes a display unit for displaying graphical user interfaces.

The features described (e.g., the decoding system 200) can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

Other embodiments are within the scope of the following claims. The techniques described herein can be performed in a different order and still achieve desirable results.

What is claimed is:

1. A method comprising:
during a first iteration of a first decoder for decoding convolutionally encoded data elements, determining a first value of a first path metric by calculating a full trace across a trellis in the forward direction and storing the first value of the first path metric, and determining a first value of a second path metric by performing a partial trace across the trellis in the reverse direction; and
during a second iteration of the first decoder, determining a second value of the first path metric by retrieving the first value of the first path metric and using the retrieved first value as an initial value of the first path metric, determining a second value of the second path metric, and storing the second value of the second path metric;
wherein storing values of the first path metric and the second path metric alternate with subsequent iterations, values of the first path metric are stored when the values of the first path metric are determined by performing a full trace in the forward direction, and values of the second path metric are stored when the values of the second path metric are determined by performing a full trace in the reverse direction.

2. The method of claim 1, further comprising:
during the first iteration of a first decoder, providing extrinsic data from the first decoder to a second decoder.

3. The method of claim 2, further comprising:
prior to the second iteration of the first decoder, receiving extrinsic data at the first decoder from the second decoder.

4. The method of claim 2, wherein the first decoder is a linear decoder of a Turbo decoder.

5. The method of claim 2, wherein the second decoder is an interleaved decoder of a Turbo decoder.

6. The method of claim 1, wherein the partial trace across a trellis in the backward direction is from initial values set to zero.

7. A computing device comprising:
a first decoder for decoding convolutionally encoded data elements, the first decoder is configured to, during a first iteration, determine a first value of a first path metric by calculating a full trace across a trellis in the reverse direction and store the first value of the first path metric in a storage medium of the computing device, and determine a first value of a second path metric by calculating a full trace across the trellis in the forward direction, the first decoder is further configured to, during a second iteration, determine a second value of the first path metric by retrieving the first value of the first path metric from the storage medium and using the retrieved first value as an initial value of the first path metric, determine a second value of the second path metric and store the second value of the second path metric in the storage medium;
wherein storing values of the first path metric and the second path metric alternate with subsequent iterations, and in subsequent iterations, values of the first path metric are stored when the values of the first path metric are determined by performing a full trace in the reverse direction, and values of the second path metric are stored when the values of the second path metric are determined by performing a full trace in the forward direction.

8. The computing device of claim 7, further comprising:
a second decoder for receiving extrinsic data from the first decoder during the first iteration.

9. The computing device of claim 8, wherein the first decoder receives extrinsic data from the second decoder prior to the second iteration of the first decoder.

10. A non-transitory computer program product tangibly embodied in an information carrier and comprising instructions stored in the information carrier that when executed by a processor perform a method comprising:
during a first iteration of a first decoder for decoding convolutionally encoded data elements, determining a first value of a first path metric and storing the first value of the first path metric in a storage medium of the information carrier, and determining a first value of a second path metric; and
during a second iteration of the first decoder, determining a second value of the first path metric by retrieving the first value of the first path metric and using the retrieved first value as an initial value of the first path metric, determining a second value of the second path metric, and storing the second value of the second path metric in the storage medium;
wherein storing values of the first path metric and the second path metric alternate with subsequent iterations, and in subsequent iterations, values of the first path metric are stored when the values of the first path metric are determined by performing a full trace in the forward direction, and values of the second path metric are stored when the values of the second path metric are determined by performing a full trace in the reverse direction.

11. The computer program product of claim 10, wherein determining the first value of the first path metric includes calculating a full trace across a trellis in the forward direction, and determining the first value of the second path metric includes calculating a full trace across a trellis in the reverse direction.

12. The computer program product of claim 10, further comprising instructions that when executed by the processor perform a method comprising:

during the first iteration of a first decoder, providing extrinsic data from the first decoder to a second decoder.

\* \* \* \* \*

UNITED STATES PATENT AND TRADEMARK OFFICE
CERTIFICATE OF CORRECTION

PATENT NO.         : 8,650,468 B2                             Page 1 of 1
APPLICATION NO.    : 12/843896
DATED              : February 11, 2014
INVENTOR(S)        : Timothy Perrin Fisher-Jeffes et al.

It is certified that error appears in the above-identified patent and that said Letters Patent is hereby corrected as shown below:

On the title page, item (73), correct the name of the assignee from "MediaTek Pte. Ltd." to --"MediaTek Singapore Pte. Ltd."--.

Signed and Sealed this
Thirteenth Day of May, 2014

Michelle K. Lee
*Deputy Director of the United States Patent and Trademark Office*